US007985615B2

(12) United States Patent
Liu et al.

(10) Patent No.: US 7,985,615 B2
(45) Date of Patent: Jul. 26, 2011

(54) METHOD OF FORMING A CARBON NANOTUBE/NANOWIRE THERMO-PHOTOVOLTAIC CELL

(75) Inventors: Fei Liu, Beacon, NY (US); Ma Siguang, Los Angeles, CA (US); Kang L. Wang, Santa Monica, CA (US)

(73) Assignee: The Regents of the University of California, Oakland, CA (US)

( * ) Notice: Subject to any disclaimer, the term of this patent is extended or adjusted under 35 U.S.C. 154(b) by 415 days.

(21) Appl. No.: 11/561,733

(22) Filed: Nov. 20, 2006

(65) Prior Publication Data
US 2007/0235076 A1 Oct. 11, 2007

Related U.S. Application Data

(60) Provisional application No. 60/739,102, filed on Nov. 21, 2005.

(51) Int. Cl.
  *H01L 21/00* (2006.01)
(52) U.S. Cl. .......... 438/92; 438/141; 438/379; 257/473; 257/476; 257/480; 257/485; 257/486; 257/E21.351; 257/E21.364
(58) Field of Classification Search ............... 438/92, 438/141, 379, FOR. 173; 257/473, 476, 257/480, 485, 486, E21.351, E21.364; 977/700, 977/701
See application file for complete search history.

(56) References Cited

U.S. PATENT DOCUMENTS

| | | | |
|---|---|---|---|
| 4,637,376 A * | 1/1987 | Varney et al. | 126/682 |
| 6,878,871 B2 * | 4/2005 | Scher et al. | 136/252 |
| 7,077,124 B2 * | 7/2006 | Szymocha | 126/643 |
| 7,442,320 B2 * | 10/2008 | Lee | 252/62.3 E |
| 2003/0189235 A1 * | 10/2003 | Watanabe et al. | 257/432 |

OTHER PUBLICATIONS

"Engineering Carbon Nanotubes and Nanotube Circuits Using Electrical Breakdown" Science, vol. 292, p. 706 to 709 (2001).*
Kong et al., "Synthesis of Individual Single-Walled Carbon Nanotubes on Patterned Silicon Wafers"; Nature vol. 395; Oct. 29, 1998; pp. 878-881.
Li et al.; "Diameter-Controlled Growth of Single-Crystalline $In_2O_3$ Nanowires and Their Electronic Properties"; Adv. Mater. 2003; vol. 15; No. 2; Jan. 16, 2003; pp. 143-146.
Zhou et al.; "Modulated Chemical Doping of Individual Carbon Nanotubes"; Science vol. 290; Nov. 24, 2000; pp. 1552-1555.
Heinze, et al.; Phys. Rev. Lett.; vol. 89; No. 10; Sep. 2, 2002; pp. 106801-1-10681-4.
Leonard, et al.; "Role of Fermi-Level Pinning in Nanotube Schottky Diodes"; Phys. Rev. Lett.; vol. 84; No. 20; May 15, 2000; pp. 4693-4696.
Javey, et al.; "Ballistic Carbon Nanotube Field-Effect Transistors"; Nature Publishing Group; vol. 424; No. 7; Aug. 2003; pp. 654-657.

\* cited by examiner

*Primary Examiner* — Thanh V Pham
(74) *Attorney, Agent, or Firm* — Ballard Spahr LLP

(57) ABSTRACT

The present invention relates to embodiments of TPV cell structures based on carbon nanotube and nanowire materials. One embodiment according to the present invention is a p-n junction carbon nanotube/nanowire TPV cell, which is formed by p-n junction wires. A second embodiment according to the present invention is a carbon nanotube/nanowire used as a p-type (or n-type), and using bulk material as the other complementary type to a form p-n junction TPV cell. A third embodiment according to the present invention uses a controllable Schottky barrier height between a one-dimensional nanowire and a metal contact to form the built-in potential of the TPV cells.

11 Claims, 4 Drawing Sheets

Thermal Radiation

US 7,985,615 B2

METHOD OF FORMING A CARBON NANOTUBE/NANOWIRE THERMO-PHOTOVOLTAIC CELL

CROSS REFERENCE TO RELATED APPLICATIONS

This application claims the benefit of U.S. Provisional Patent Application No. 60/739,102 filed Nov. 21, 2005, which is fully incorporated herein by reference and made a part hereof.

BACKGROUND

1. Field of the Invention

The present invention generally pertains to thermo-photovoltaic (TPV) technology and more particularly to the application of nanotechnology to TPV cells.

2. Background of the Invention

TPV energy conversion is a conversion process from heat differentials to electricity via photons. A basic thermophotovoltaic system is comprised of a thermal emitter and a photovoltaic diode cell. The temperature of the thermal emitter can vary and, in principle, TPV devices can extract energy from any emitter with temperature elevated above that of the photovoltaic device (forming an optical to electricity engine). The emitter can be a piece of solid material or a specially engineered structure. A conventional solar cell is effectively a TPV device in which the sun functions as the emitter. Thermal emission is the spontaneous emission of photons related to the thermal motion of charges in the material. For normal TPV temperatures, this radiation is mostly at near infrared and infrared frequencies. The photovoltaic diodes can absorb some of these radiated photons and convert them into free charge carriers, that is electricity.

Thermophotovoltaic systems have few, if any, moving parts and are therefore very quiet and require low maintenance. These properties make thermophotovoltaic systems suitable for remote-site and portable electricity-generating applications. Their efficiency-cost properties, however, are often rather poor compared to other electricity-generating technologies.

Carbon nanotubes (CNTS) are an allotrope of carbon. They take the form of cylindrical carbon molecules and have novel properties that make them potentially useful in a wide variety of applications in nanotechnology, electronics, optics and other fields of materials science. They exhibit extraordinary strength and unique electrical properties, and are efficient conductors of heat. Carbon nanotubes and other inorganic nanowires have also been synthesized.

Nanotubes are members of the fullerene structural family, which also includes buckyballs. Whereas buckyballs are spherical in shape, a nanotube is cylindrical, with at least one end typically capped with a hemisphere of the buckyball structure. Their name is derived from their size, since the diameter of a nanotube is on the order of a few nanometers (approximately 50,000 times smaller than the width of a human hair), while they can be up to several millimeters in length. There are two main types of nanotubes: single-walled nanotubes (SWNTs) and multi-walled nanotubes (MWNTs).

Currently, TPV cells are generally based on the traditional semiconductor thin film technology. For a radiation source temperature of 1500K, a cell efficiency of roughly 20% is obtained when the TPV cells operate at room temperature. However, TPV efficiency degrades greatly with increasing cell operating temperature. Currently, it is difficult to obtain efficiency over 30% with the cell temperature of 400K for space power conversion. On the other hand, a low cost TPV having commercial applicability is of great interest.

Therefore, what is needed is a low-cost TPV with a greater cell efficiency that overcomes many of the challenges found in the art, some of which are described above.

SUMMARY

Embodiments according to the present invention employ nanodevices to improve the performance of TPV cells. More particularly, embodiments of carbon nanotube/nanowire based TPV cells are described herein.

In one aspect according to the present invention, a carbon nanotube/nanowire p-n junction TPV cell is described.

In another aspect according to the present invention, a carbon nanotube/nanowire-bulk semiconductor p-n junction is described.

In yet another aspect according to the present invention, a Schottky-barrier TPV cell sheet for high performance low cost thermo-photovoltaic applications is described.

Additional advantages of the invention will be set forth in part in the description which follows, and in part will be obvious from the description, or may be learned by practice of the invention. It is to be understood that both the foregoing general description and the following detailed description are exemplary and explanatory only and are not restrictive of the invention.

DETAILED DESCRIPTION OF THE DRAWINGS

The accompanying drawings, which are incorporated in and constitute a part of this specification, illustrate certain aspects of the instant invention and together with the description, serve to explain, without limitation, the principles of the invention and like reference characters used therein indicate like parts throughout the several drawings.

DETAILED DESCRIPTION

Figure 1A:
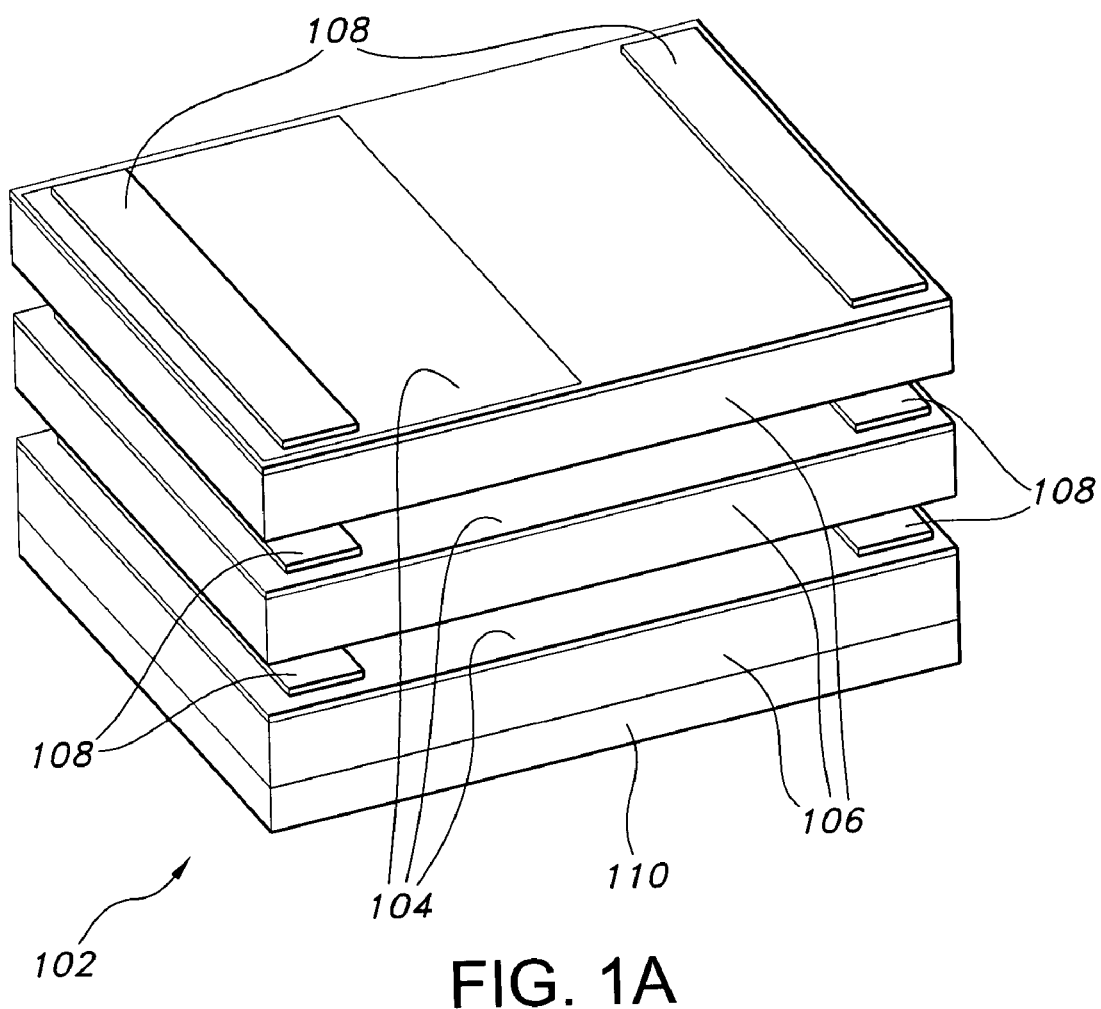
FIG. 1A is an illustration of an embodiment according to the present invention that comprises a p-n junction carbon nanotube/nanowire TPV cell, which is formed by p-n junction wires formed in a stack of CNT sheets and by controlling the diameter of the CNTs, the TPV cell absorption will match to the radiation spectra.

The present invention may be understood more readily by reference to the following detailed description of the invention and the examples included therein and to the figures and their previous and following description.

Before the present systems, articles, devices, and/or methods are disclosed and described, it is to be understood that this invention is not limited to specific systems, specific devices, or to particular methodology, as such may, of course, vary. It is also to be understood that the terminology used herein is for the purpose of describing particular embodiments only and is not intended to be limiting.

The following description of the invention is provided as an enabling teaching of the invention in its best, currently known embodiment. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

As used in the specification and the appended claims, the singular forms "a," "an" and "the" include plural referents unless the context clearly dictates otherwise. Thus, for example, reference to "a reflector" includes two or more such reflectors, and the like.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that when a value is disclosed that "less than or equal to" the value, "greater than or equal to the value" and possible ranges between values are also disclosed, as appropriately understood by the skilled artisan. For example, if the value "10" is disclosed the "less than or equal to 10" as well as "greater than or equal to 10" is also disclosed. It is also understood that throughout the application, data is provided in a number of different formats and that this data represents endpoints and starting points, and ranges for any combination of the data points. For example, if a particular data point "10" and a particular data point 15 are disclosed, it is understood that greater than, greater than or equal to, less than, less than or equal to, and equal to 10 and 15 are considered disclosed as well as between 10 and 15. It is also understood that each unit between two particular units are also disclosed. For example, if 10 and 15 are disclosed, then 11, 12, 13, and 14 are also disclosed.

"Optional" or "optionally" means that the subsequently described event or circumstance may or may not occur, and that the description includes instances where said event or circumstance occurs and instances where it does not.

Embodiments of TPV cell structures based on carbon nanotube and nanowire materials are described herein. One embodiment according to the present invention is a p-n junction carbon nanotube/nanowire TPV cell, which is formed by p-n junction wires. A second embodiment according to the present invention is a carbon nanotube/nanowire used as a p-type (or n-type), and using bulk material as the other complementary type to a form p-n junction TPV cell. A third embodiment according to the present invention uses a controllable Schottky barrier height between a one-dimensional nanowire and a metal contact to form the built-in potential of the TPV cells.

Carbon Nanotube/Nanowire p-n Junction TPV

Figure 1B:
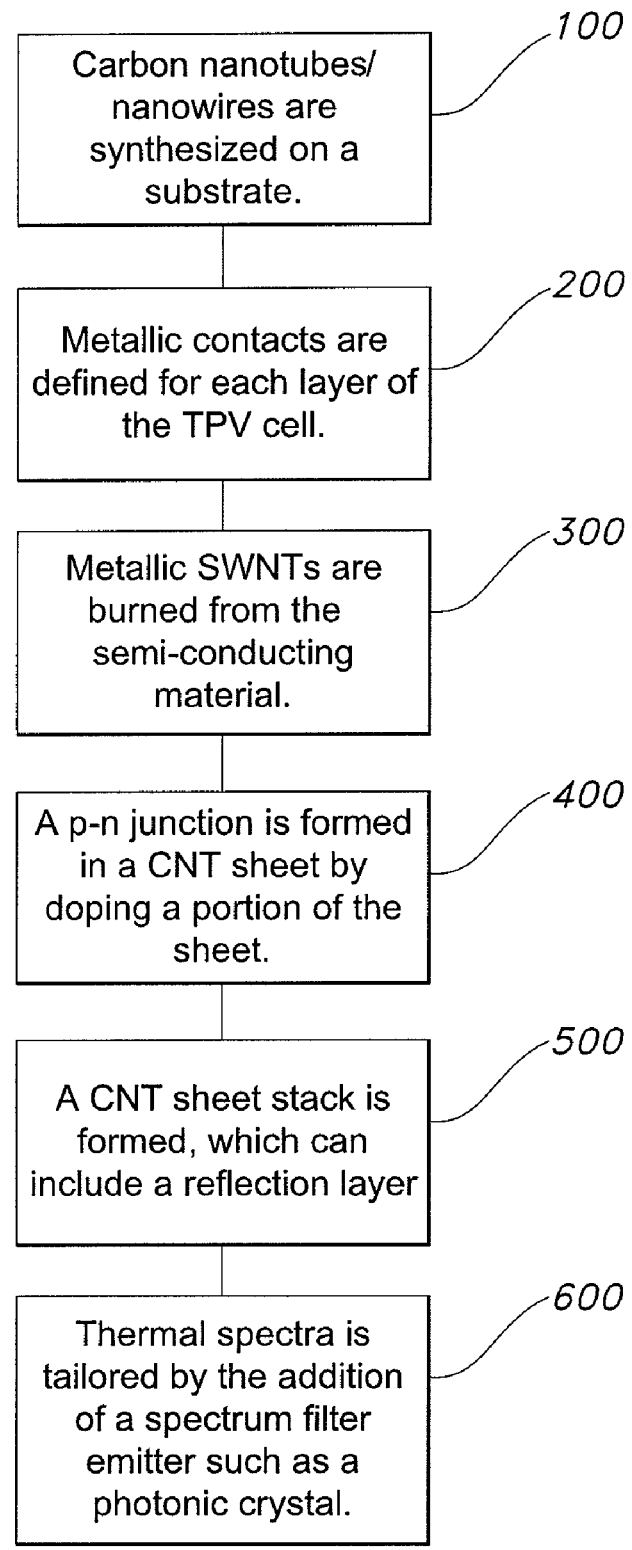
FIG. 1B is an exemplary flowchart describing the steps for creating an embodiment of a p-n junction carbon nanotube/nanowire TPV cell.

As shown in FIG. 1A, an embodiment according to the present invention comprises a p-n junction carbon nanotube/nanowire TPV cell 102, which is formed by p-n junction wires. FIG. 1B is an exemplary flowchart describing the steps for creating a p-n junction carbon nanotube/nanowire TPV cell 102 as shown in FIG. 1A.

Step 100 comprises synthesizing carbon nanotubes (CNTs)/nanowires. In one embodiment, CNT/nanowire sheet 104 can be grown by using self-assembled growth methods such as, for example, chemical vapor deposition (CVD) method [1], or a laser ablation process [2]. Carbon nanotube/nanowire sheets 104 can be formed on top of almost any type substrate 106 such as, for example, flexible plastic sheets, silicon, silicon carbide (SiC), etc., without the need to match the lattice constant. The length of one-dimensional CNTs/nanowires is on the order of several micrometers. A TPV cell comprised of single-wall carbon nanotubes (SWNTs) is described herein, while it is to be appreciated that other kinds of nanowire TPV cells can be formed by using similar methods. In one embodiment, SWNTs are created by rolling of a graphene sheet into what are known as "buckytubes," as is known to one of ordinary skill in the art.

The bandgap of a SWNT strongly depends on its diameter and chirality (chemical "handedness") [3]. As is known to one of ordinary skill in the art, SWNTs can be metallic, semi-conducting, and semi-metallic according to their chiralities. The bandgap of semi-conducting SWNTs is roughly inversely proportional to its diameter, i.e., $E_g$(in eV) $\cong 1/d$ (diameter in nm) for semi-conducting SWNTs. The bandgap has a dependence of, $E_g$(in eV) $\cong 1/d^2$ (diameter in nm) for the semi-metallic SWNTs [4]. This means the SWNTs cover a wide range of the spectrum of optical absorption from infra-red to far-infrared. Furthermore, with the development of CNT synthesis technology, it is possible to control the bandgap of SWNTs in a certain range.

At step 200, contacts 108 are defined for the TPV device. Currently, CNTs having a length of several millimeters can be synthesized, though by current standard synthesis methods, a length of few microns is normally obtained. Because the length of a CNT is generally on the order of several micrometers, standard photolithography as is known to one of ordinary skill in the art, can be used to define contact pads 108 for each layer of a stack, as shown in FIG. 1A. As standard CNT length becomes longer, it will make TPV cell fabrication easier and improve device performance.

At step 300, metallic SWNTs are burned or filtered out from the semi-conducting material. It is to be noted that this step will become less important and possibly unnecessary as the fabrication and selection of CNTs improves. Currently, however, about one-third of SWNTs are metallic wires after synthesis rather than semi-conductors. Metallic CNTs cannot convert thermal energy into electrical power and will short-circuit semi-conducting CNTs, making a TPV inoperative. In order to overcome this challenge, the metallic SWNTs can be burned by applying a suitably high voltage between the contacts 108. As the fabrication of CNT improves, it is possible that this step may become unnecessary.

Step 400 comprises forming a p-n junction CNT sheet. After SWNT synthesis, semi-conducting SWNTs are usually p-type. In order to form p-n junctions, an n-type doping is used. For example, potassium doping can be carried out in vacuum while covering half of the area between two contacts by polymethyl methacrylate (PMMA), as known to one of ordinary skill in the art [5]. Passivation, as is known to one of ordinary skill in the art, can be carried out for better insulation and stability for the devices.

Step 500 comprises making a CNT sheet stack, as shown in FIG. 1A. Because of the small diameter of a CNT, a single layer of CNT sheet cannot absorb and convert all the thermal energy. Moreover, the variation of the SWNT bandgap should remain small in each layer to maximize the output voltage. In order to achieve the benefit of broad coverage of the SWNT bandgap spectra, CNT sheets with different bandgaps in each layer can be put on top of each other to form a stack as shown in FIG. 1A. In one embodiment, a backside reflection layer 110 can be used to maximize thermal absorption.

Figure 1C:
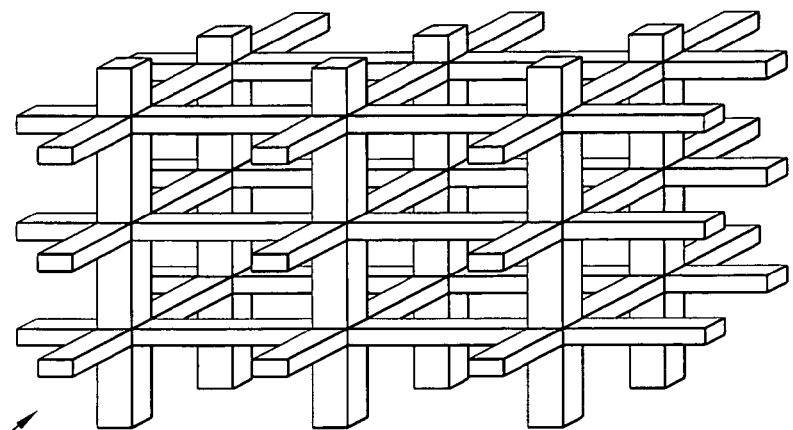
FIG. 1C is an exemplary spectrum filter emitter comprised, in this instance, of a photonic crystal that may be used to practice one or more aspects according to the present invention.
Figure 1D:
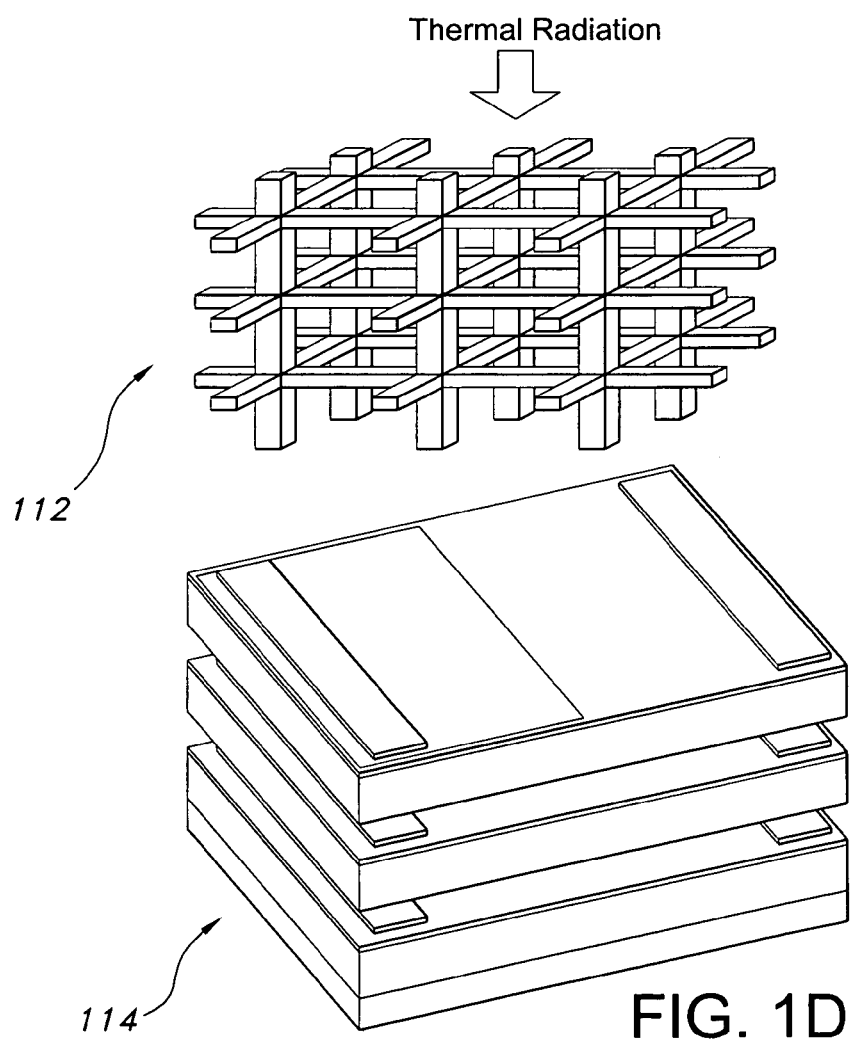
FIG. 1D is an illustration of the TPV cell of FIG. 1A further comprising a refection plate and a photonic crystal, which improves cell efficiency.

Step 600 comprises tailoring thermal spectra by a photonic crystal. To further improve the conversion efficiency of TPV cells, spectrum filter emitters, such as, for example, a photonic crystal 112 as shown in FIG. 1C or a dielectric stack, are utilized on the top of the CNT sheet stack 102, as shown in the device 114 of FIG. 1D.

Carbon Nanotube/Nanowire Bulk Semi-Conductor p-n Junction TPV

Figure 2A:
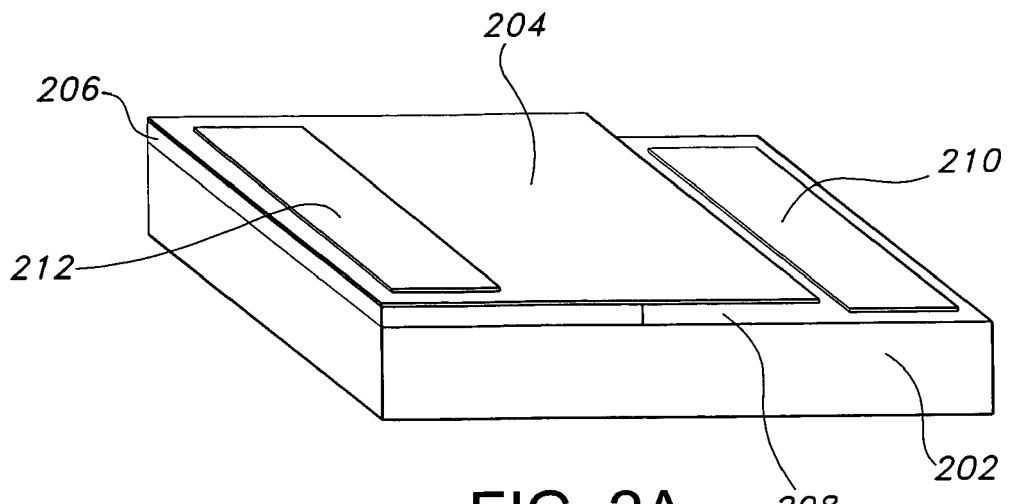
FIG. 2A is an illustration of an embodiment of a carbon nanotube/nanowire TPV that comprises a carbon nanotube/nanowire-bulk semiconductor p-n junction TPV that uses a nanowire as p-type (or n-type) semiconductor and a bulk semiconductor material with a suitable bandgap (the bandgap is tuned during the design according to radiation spectra) as n-type (or p-type) to form the p-n junction.
Figure 2B:
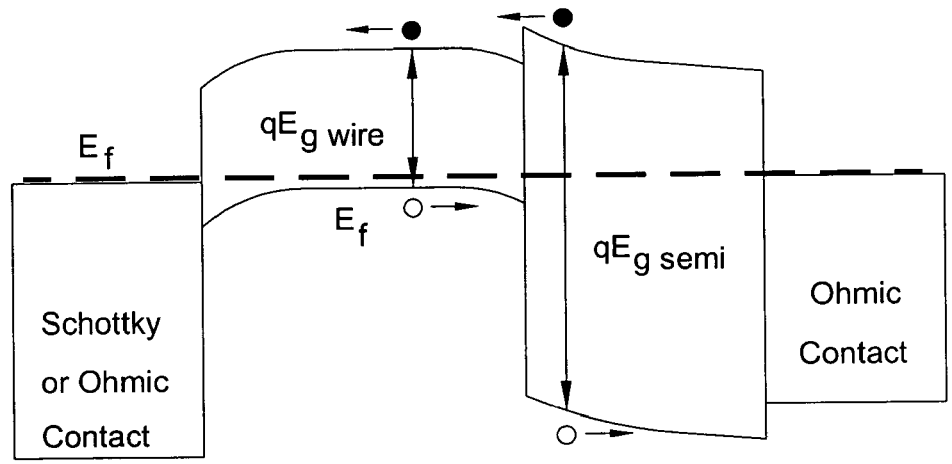
FIG. 2B is an illustration of a band diagram of the embodiment of the TPV cell of FIG. 2A.

Different from carbon nanotube/nanowire p-n junction TPV described above, a second embodiment of a carbon nanotube/nanowire TPV comprises a carbon nanotube/nanowire bulk semiconductor p-n junction TPV that uses a nanowire as p-type (or n-type) semiconductor and a bulk semiconductor material with a suitable bandgap as n-type (or p-type) to form the p-n junction as shown in FIG. 2A. The embodiment of FIG. 2A can be formed by applying a contact 210 to the semiconductor 202 in one part of the device and by applying a second contact 212 to the nanotube/nanowire 204 at the other end of the device. A portion of the nanowire sheet 204 can be insulated from the semiconductor 202 with an insulating material 206 in order to control the size and location of the heterogeneous p-n junction 208. The band diagram of the embodiment of the TPV cell of FIG. 2A is shown in FIG. 2B. The heterogeneous p-n junction 208 is configured to maximize the power conversion.

Carbon Nanotube/Nanowire Schottky-Barrier TPV

A Schottky-barrier, as known in the art to one of ordinary skill, is normally created in a metal-carbon nanotube junction [6], which limits the transport of the carbon nanotube (CNT) field effect transistor (FET). However, different from metal semiconductor planar contacts, there is a very weak Fermi level pinning effect for the metal-CNT Schottky contact due to the one-dimensional geometry of CNTs [7]. This property gives the opportunity to improve CNT-FETs by selecting suitable work function metals as contacts [8]. An embodiment of a TPV cell is provided by engineering the Schottky contacts in the CNT-metal contacts.

Figure 3:
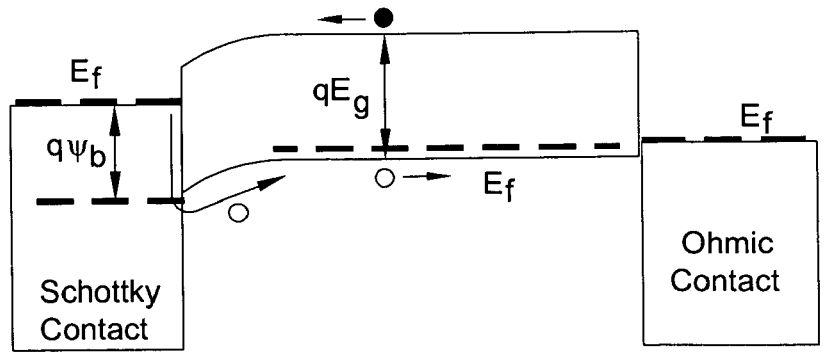
FIG. 3 is an illustration of a band diagram of an exemplary Schottky-barrier TPV cell.

As a first step, SWNTs can be grown on a substrate such as silicon, sapphire, SiC, glass, flexible plastics or other substrates, depending on the different applications. A metal Schottky barrier, such as, for example, a Ti/Au contact can be deposited on the SWNTs. An ohmic contact can be formed by depositing metal such as, for example, palladium on the SWNTs. If there is a backside gate similar to the p-n junction carbon nanotube/nanowire TPV, then the width of the Schottky barrier and the Fermi energy level of the nanowire can be tuned by applying the backside gate. The ohmic and Schottky contacts may be made transparent, thin and/or small to minimize absorption loss in the contact. The band diagram of an exemplary Schottky-barrier TPV cell is shown in FIG. 3.

Similar to the carbon nanotube/nanowire p-n junction TPV described above, in a second step, broadband matching can be obtained by making stacks of TPV cell layers in series; i.e., in each layer, the Schottky-barrier TPV cells are made of different metal material and different SWNT chirality so that the height of the Schottky barriers and the bandgap of the SWNT can be tuned.

Vertical Carbon Nanotube/Nanowire TPV Cell

To increase the absorption per unit area, vertical p-n junction or Schottky barrier carbon nanotube/nanowire TPV cells can be designed similarly by using the methods as described previously.

CONCLUSION

Although several aspects of the present invention have been disclosed in the foregoing specification, it is understood by those skilled in the art that many modifications and other aspects of the invention will come to mind to which the invention pertains, having the benefit of the teaching presented in the foregoing description and associated drawings. It is thus understood that the invention is not limited to the specific aspects disclosed hereinabove, and that many modifications and other aspects are intended to be included within the scope of the appended claims. For instance, because the optical and electrical properties of the TPV can be changed by controlling the diameter and chirality during fabrication, the carbon nanotube TPV cells are suitable to several TPV applications. Examples of such applications include, for example, high-performance low radiation temperature TPV for space applications and low-cost TPV cell systems for the next generation electrical conversion, among other applications. Moreover, although specific terms are employed herein, as well as in the claims which follow, they are used only in a generic and descriptive sense, and not for the purposes of limiting the described invention.

REFERENCES

[1] J. Kong, H. T. Soh, A. M. Cassell, C. F. Quate, H. J. Dai, Nature 395, 878(1998);
[2] C. Li, D. Zhang, S. Han, X. Liu, T. Tang, and C. Zhou, Adv. Mater. 15, 143 (2003);
[3] M. S. Dresselhaus, G. Dresselhaus, P. Avouris, Eds., *Carbon Nanotubes: Synthesis, Structure, Properties, and Applications*, vol. 80 (Springer, Berlin, 2001);
[4] R. Saito. G. Dresselhaus, and M. S. Dresselhaus, Physical Properties of Carbon Nanotubes, Imperial College Press, London, 1998;
[5] C. Zhou, J. Kong, E. Yenilmez, H. Dai, Science 290, 1552 (2000);
[6] S. Heinze, J. Tersoff, R. Martel, V. Derycke, J. Appenzeller, and Ph. Avouris, Phys. Rev. Lett. 89, 106801 (2002);
[7] F. Leonard and J. Tersoff, Phys. Rev. Lett. 84, 4693 (2000); and
[8] A. Javey, J. Guo, Q. Wang, M. Lundstrom, and H. Dai, Nature 424, 654 (2003).

What is claimed is:
1. A method of forming a nanotube/nanowire thermo-photovoltaic (TPV) cell, the method comprising:
 forming a carbon nanotube/nanowire sheet, wherein the forming step comprises:
  synthesizing a layer of semi-conducting carbon nanotubes/nanowires on a substrate;

depositing at least two metallic contacts on said layer of semi-conducting carbon nanotubes/nanowires;

burning any metallic carbon nanotubes/nanowires from said layer of semi-conducting nanotubes/nanowires by applying a suitable voltage between that at least two metallic contacts;

forming a p-n junction in said layer of semi-conducting nanotubes/nanowires by doping at least a portion of said layer of semi-conducting nanotubes/nanowires;

making a plurality of carbon nanotube/nanowire sheets by repeating the forming step, wherein the making step comprises tuning an energy bandgap of each carbon nanotube/nanowire sheet of the plurality by, synthesizing single wall carbon nanotubes of different chirality in the layer of semi-conducting carbon nanotubes/nanowires on the substrate in each carbon nanotube/nanowire sheet of the plurality, and depositing different metal materials in the at least two metallic contacts in each carbon nanotube/nanowire sheet of the plurality; and stacking the plurality of carbon nanotube/nanowire sheets in series for broadband matching of a blackbody radiation spectrum.

2. The method of claim 1,
wherein the energy bandgap of each carbon nanotube/nanowire sheet is different than an energy bandgap of any adjacent carbon nanotube/nanowire sheet of the plurality.

3. The method of claim 2, wherein a stack resulting from the stacking step comprises a backside reflection layer.

4. The method of claim 1, wherein doping at least a portion of said layer of semi-conducting nanotubes/nanowires comprises doping a portion of said layer of semi-conducting nanotubes/nanowires with potassium in a vacuum while covering half of the area between said at least two metallic contacts by polymethyl methacrylate (PMMA).

5. The method of claim 2, wherein tuning the energy bandgap of each carbon nanotube/nanowire sheet of the plurality comprises varying the diameter of carbon nanotubes/nanowires in at least one of each carbon nanotube/nanowire sheets of the plurality.

6. The method of claim 5, wherein the plurality has at least one carbon nanotube/nanowire sheet having carbon nanotubes/nanowires with an average diameter of approximately 1 nanometer.

7. The method of claim 5, wherein the plurality has at least one carbon nanotube/nanowire sheet having carbon nanotubes/nanowires with an average diameter of approximately 3 nanometers.

8. The method of claim 1, wherein synthesizing a layer of semi-conducting carbon nanotubes/nanowires on a substrate comprises synthesizing a layer of semi-conducting carbon nanotubes/nanowires on a substrate having a lattice constant different from that of said layer of semi-conducting carbon nanotubes/nanowires.

9. The method of claim 1, wherein synthesizing a layer of semi-conducting carbon nanotubes/nanowires on a substrate comprises synthesizing a layer of semi-conducting carbon nanotubes/nanowires on a substrate comprised of silicon, SiC, glass, rigid plastics, flexible plastics or sapphire.

10. The method of claim 2, wherein said stack further comprises a spectrum filter emitter.

11. The method of claim 2, wherein said stack further comprises a spectrum filter emitter comprised of a photonic crystal.

* * * * *

UNITED STATES PATENT AND TRADEMARK OFFICE
CERTIFICATE OF CORRECTION

PATENT NO.        : 7,985,615 B2
APPLICATION NO.   : 11/561733
DATED             : July 26, 2011
INVENTOR(S)       : Fei Liu, Siguang Ma and Kang L. Wang It is certified that error appears in the above-identified patent and that said Letters Patent is hereby corrected as shown below:

Title Page, Item (75) Inventors: please replace "Ma Siguang" with --Siguang Ma--.

Signed and Sealed this
Eighteenth Day of October, 2011

David J. Kappos
*Director of the United States Patent and Trademark Office*